(12) United States Patent
Chia et al.

(10) Patent No.: US 11,917,832 B2
(45) Date of Patent: Feb. 27, 2024

(54) FERROELECTRIC TUNNEL JUNCTION DEVICES WITH METAL-FE INTERFACE LAYER AND METHODS FOR FORMING THE SAME

(71) Applicant: Taiwan Semiconductor Manufacturing Company Limited, Hsinchu (TW)

(72) Inventors: Han-Jong Chia, Hsinchu (TW); Mauricio Manfrini, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/109,161

(22) Filed: Feb. 13, 2023

(65) Prior Publication Data

US 2023/0209837 A1 Jun. 29, 2023

Related U.S. Application Data

(62) Division of application No. 17/228,555, filed on Apr. 12, 2021, now Pat. No. 11,581,335.

(60) Provisional application No. 63/042,600, filed on Jun. 23, 2020.

(51) Int. Cl.
| | |
|---|---|
| *H01L 29/78* | (2006.01) |
| *H01L 27/11* | (2006.01) |
| *H10B 51/30* | (2023.01) |
| *H01L 29/66* | (2006.01) |
| *H01L 21/28* | (2006.01) |

(52) U.S. Cl.
CPC ........ *H10B 51/30* (2023.02); *H01L 29/40111* (2019.08); *H01L 29/6684* (2013.01); *H01L 29/7851* (2013.01); *H01L 29/78391* (2014.09)

(58) Field of Classification Search
CPC ........... H01L 27/1159; H01L 29/40111; H01L 29/6684; H01L 29/78391; H01L 29/7851; H01L 28/55; H01L 28/75; H01L 27/11507; H01L 29/66545; H01L 27/11592; H01L 29/516
USPC ......................................................... 257/295
See application file for complete search history.

(56) References Cited

U.S. PATENT DOCUMENTS

| | | | |
|---|---|---|---|
| 2010/0110753 A1* | 5/2010 | Slesazeck .............. | H10B 51/30 365/182 |
| 2014/0070289 A1* | 3/2014 | Tanaka ................... | H10B 51/30 257/295 |
| 2014/0153312 A1* | 6/2014 | Sandhu .............. | G11C 13/0007 257/295 |
| 2014/0362634 A1* | 12/2014 | Ramaswamy ......... | H10B 63/80 257/5 |
| 2017/0345831 A1* | 11/2017 | Chavan ................... | H01L 28/60 |
| 2018/0082729 A1* | 3/2018 | Slesazeck ........... | G11C 11/5657 |
| 2018/0358471 A1* | 12/2018 | Yoo ...................... | G11C 11/2275 |

(Continued)

*Primary Examiner* — Sheikh Maruf
(74) *Attorney, Agent, or Firm* — The Marbury Law Group, PLLC

(57) ABSTRACT

A memory device, transistor, and methods of making the same, the memory device including a memory device including: a ferroelectric (FE) structure including: a dielectric layer, an FE layer disposed on the dielectric layer, and an interface metal layer disposed on the FE layer, in which the interface metal layer comprises W, Mo, Ru, TaN, or a combination thereof to induce the FE layer to have an orthorhombic phase; and a top electrode layer disposed on the interface metal.

20 Claims, 17 Drawing Sheets

(56) References Cited

U.S. PATENT DOCUMENTS

| | | | |
|---|---|---|---|
| 2019/0019802 A1* | 1/2019 | Yoo | H01L 29/517 |
| 2019/0148390 A1* | 5/2019 | Frank | H10B 53/30 |
| | | | 257/295 |
| 2020/0152644 A1* | 5/2020 | Karda | G11C 11/2257 |
| 2021/0233587 A1* | 7/2021 | Lu | G11C 7/1096 |
| 2022/0285392 A1* | 9/2022 | Servalli | H01L 28/90 |
| 2022/0310654 A1* | 9/2022 | Choi | H01L 29/66545 |

* cited by examiner

400

500

FERROELECTRIC TUNNEL JUNCTION DEVICES WITH METAL-FE INTERFACE LAYER AND METHODS FOR FORMING THE SAME

RELATED APPLICATIONS

This application is a divisional application of U.S. patent application Ser. No. 17/228,555, entitled "Ferroelectric Tunnel Junction Devices with Metal-Fe Interface Layer and Methods of Forming the Same," filed on Apr. 21, 2021, which claims priority to U.S. Provisional Patent Application No. 63/042,600 entitled "Metal-FE interface in Ferroelectric Tunnel Junctions", filed on Jun. 23, 2020, the entire contents of both are hereby incorporated by reference for all purposes.

BACKGROUND

Ferroelectric (FE) memory is a candidate for next generation non-volatile memory benefits due to its fast write/read speed and small size. However, it may be difficult to achieve a desired crystal structure when growing FE layers on commonly utilized semiconductor device materials. Various materials may be used to form the FE layer that may improve the FE properties such as coercivity ($E_c$), remanent polarization ($P_r$), hysteresis loop squareness (saturation remanence divided by saturation magnetization), etc. In particular, various techniques and materials may be used to obtain high orthorhombic crystalline phase FE layer in order to obtain good FE properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
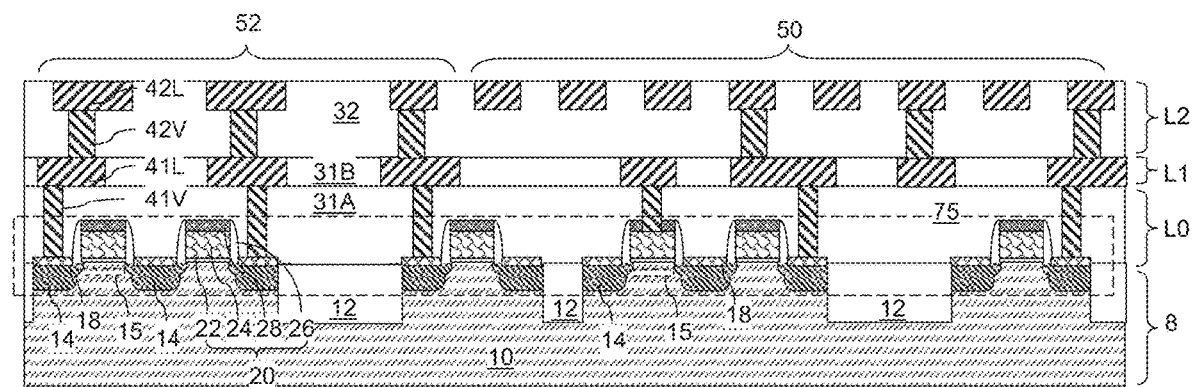
FIG. 1A is a vertical cross-sectional view of a first exemplary structure prior to formation of an array of thin-film transistors (TFTs) according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to ferroelectric (FE) device, and specifically, to memory cells, transistors, and memory structures that include thin interface metals deposited between FE layers and top electrode metals. The metal-FE interface plays a significant role in determining the FE crystalline phase. FE properties such as coercivity ($E_c$), remanent polarization ($P_r$), hysteresis loop squareness (saturation remanence divided by saturation magnetization), etc. may be greatly influenced by the materials with which the FE layer forms interfaces. In particular, for HfO based ferroelectric materials, high orthorhombic crystalline phase may be implemented to obtain good FE properties. In conventional FE devices, the dielectric and/or top metal in contact with the FE layer may not provide a good interface to induce the FE for forming the orthorhombic crystalline phase.

Memory devices include a grid of independently functioning memory cells formed on a substrate. Memory devices may include volatile memory or nonvolatile (NV) memory cells. In contrast to volatile memory cells that require constant power to retain their memory values, non-volatile memory cells are capable of retaining information when power is not applied thereto. For example, computers including nonvolatile memory cells do not need to be booted up when switched on.

Emerging nonvolatile memory technologies may include resistive random-access memory (RRAM or ReRAM), magneto-resistive random-access memory (MRAM), ferroelectric (FE) random-access memory (FRAM, F-RAM, or FeRAM), and phase-change memory (PCM), for example.

FRAM is a random-access memory that utilizes memory cells that include a FE material to store information as FE polarization. An FE material has an equilibrium-state bulk electric dipole moment. This occurs in solid ceramics when ground state crystal structure involves spatial separation of ionic charges, and the unit cell lacks a center of symmetry. Nanoscale alignment of the microscopic electric dipole moments is responsible for bulk ferroelectric behavior. Typically, the magnitude of the dipole polarization and its orientation may be controlled by application of modest external electric fields. The change in orientation may be a good indication of the stored value.

FRAM is commonly organized in single-transistor, single-capacitor (1T/1C) or two-transistor, two-capacitor (2T/2C) configurations, in which each memory cell includes one or more access transistors. The non-volatility of an FRAM is due to the bi-stable characteristic of the FE material in the cell capacitor(s). The cells are typically organized in an array, such as folded-bit line, open-bit line architectures, etc., wherein the individual cells are selected by plate line and word line signals from address decoder circuitry, with the data being read from or written to the cells along bit lines using sense amp circuits. For example, in an open-bit line architecture, the bit-lines may be divided into multiple segments, and differential sense amplifiers may be placed in between bit-line segments. Because the sense amplifiers may be placed between bit-line segments, to route their outputs outside the array, an additional layer of interconnect placed above those used to construct the word-lines and bit-lines may be required. The folded bit-line array architecture routes bit-lines in pairs throughout the array. The close proximity of the paired bit-lines may provide superior common-mode noise rejection characteristics over open bit-line arrays. Folded-bit line architecture may be favored in modern DRAM ICs for its superior noise immunity. This architecture is referred to as folded because it takes its basis from the open array architecture from the perspective of the circuit schematic. The folded array architecture appears to remove DRAM cells in alternate pairs (because two DRAM cells share a single bit-line contact) from a column, then move the DRAM cells from an adjacent column into the voids.

FRAM memory cells may include a FE tunnel junction (FTJ). Generally, a FTJ may include a metal-FE-metal (MFM) structure, including an FE layer disposed between two metallic layers (e.g., electrodes). However, some FTJ's may include metal-FE-insulator-metal (MFIM) structure, where a dielectric layer is disposed between the FE layer and one of the metallic layers. In particular, the MFIM structure may provide improved charge response, as compared to the MFM structure.

Ferroelectric field effect transistors (FeFETs) are emerging devices, in which a FE layer is utilized as a gate insulating layer between a gate electrode and a channel region of an underlying semiconductor layer. Permanent electrical field polarization in the FE layer causes this type of device to retain the transistor's state (on or off) in the absence of any electrical bias.

The FE properties of an FE layer, such as coercive field (Ec), remnant polarization (Pr), polarization-electric field (P-E) loop squareness, etc., may depend upon the crystal structure of the FE layer. The crystal structure of the FE layer may further depend upon the materials in which the FE layer is directly contacting to form an FE interface. In addition, the crystal structure of a FE layer may be greatly influenced by the substrate upon which an FE layer is grown. In particular, for hafnium oxide (HfO)-based ferroelectric materials, good FE properties may be dependent upon having a well-formed orthorhombic crystalline phase. For example, FE materials, such as hafnium oxide doped Zr, require a strong orthorhombic phase to exhibit high polarization and coercive field. Both of these properties impact the FE device's ability to maintain data in memory. However, a dielectric and/or top metal in contact with the FE may not provide good interfaces to induce the FE for forming the orthorhombic phase. Certain metals may promote the growth of the desired crystal phase within the FE. However, some of these metals at high thicknesses may not be ideal for integration in an FE-based device. For example, some of these metals may be difficult to etch, have high resistivity, etc. Thus, various embodiments address these issues by implementing a thin metal layer to induce an orthorhombic phase in the FE. A metal, such as to form a top electrode, may be disposed over the metal interface layer to cap the FE structure. The metal top electrode layer may be more conducive to device processing.

Accordingly, various embodiments provide methods of forming FE structures having improved FE properties, and transistors and memory cells including the same. In particular, various embodiments provide FE structures including an interface metal layer deposited on a ferroelectric layer, in which the interface metal may induce the formation of an orthorhombic crystal structure between an FE layer and a metal layer. In various embodiments, an interface metal may be deposited on top of an FE layer to induce a strong orthorhombic phase in the FE. A top metal with lower resistivity may then be deposited on top of the interface metal to lower the total resistance of the FE structure. The thin interface metal between the FE layer and top metal layer may promote the formation of an orthorhombic crystal phase in the FE.

FIG. 1A is a vertical cross-sectional view of a first exemplary structure prior to formation of an array of memory devices according to an embodiment of the present disclosure. Referring to FIG. 1A, a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

For example, the at least one array of non-volatile memory cells may include resistive random-access memory (RRAM or ReRAM), magnetic/magneto-resistive random-access memory (MRAM), FeRAM, and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs and memory devices are to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first (ILD) layer 31B. The first (ILD) layer 31B is also referred to as a first line-level dielectric layer. The first metal lines 41L may contact a respective one of the contact via structures 41V. The second interconnect-level structure L2 includes a second (ILD) layer 32, which may include a stack of a first via-level dielectric material layer and a second line-level dielectric material layer or a line-and-via-level dielectric material layer. The second (ILD) layer 32 may have formed there within second interconnect-level metal interconnect structures (42V, 42L), which includes first metal via structures 42V and second metal lines 42L. Top surfaces of the second metal lines 42L may be coplanar with the top surface of the second (ILD) layer 32.

Figure 1B:
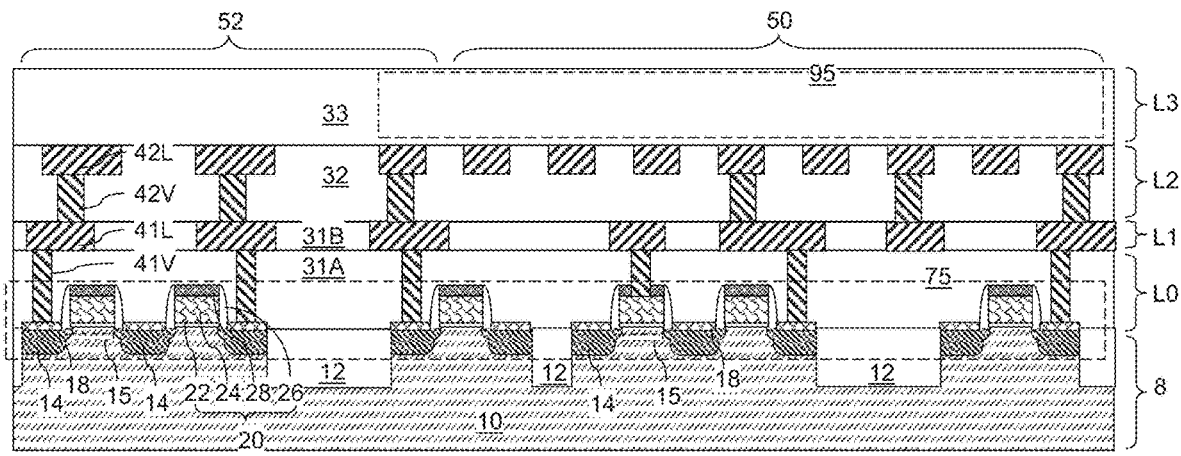
FIG. 1B is a vertical cross-sectional view of the first exemplary structure during formation of the array of fin back gate field effect transistors according to an embodiment of the present disclosure.

FIG. 1B is a vertical cross-sectional view of the first exemplary structure during formation of the array of TFTs and/or memory cells according to an embodiment of the present disclosure. Referring to FIG. 1B, an array 95 of non-volatile memory cells and selector devices, such as TFT selectors, may be formed in the memory array region 50 over the second interconnect-level structure L2. The details for the structure and the processing steps for the array 95 of non-volatile memory cells and TFT selector devices are subsequently described in detail below. A third (ILD) layer 33 may be formed during formation of the array 95 of non-volatile memory cells and TFT selector devices. The set of all structures formed at the level of the array 95 of non-volatile memory cells and TFT selector devices transistors is herein referred to as a third interconnect-level structure L3.

Figure 1C:
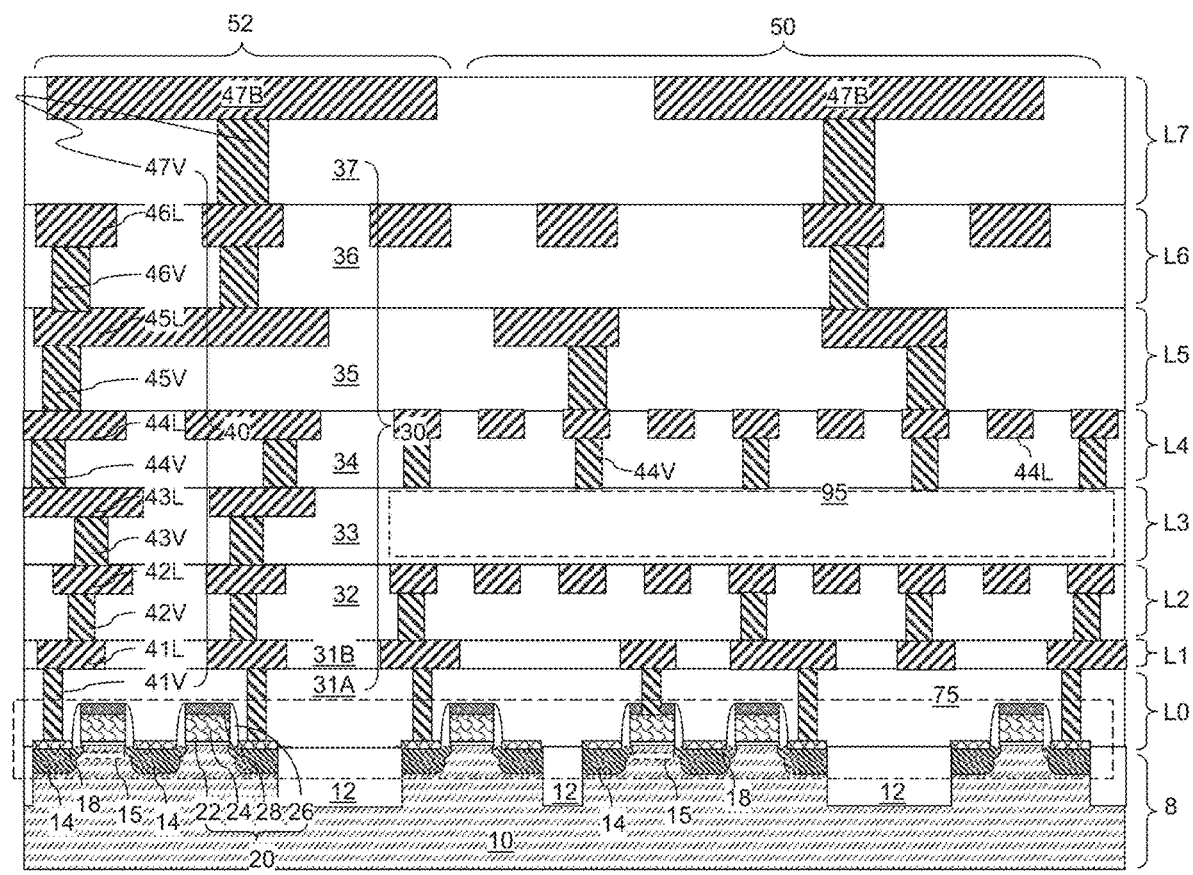
FIG. 1C is a vertical cross-sectional view of the first exemplary structure after formation of upper-level metal interconnect structures according to an embodiment of the present disclosure.

FIG. 1C is a vertical cross-sectional view of the first exemplary structure after formation of upper-level metal interconnect structures according to an embodiment of the present disclosure. Referring to FIG. 1C, third interconnect-level metal interconnect structures (43V, 43L) may be formed in the third (ILD) layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth (ILD) layer 34 having formed therein fourth interconnect-level metal interconnect structures (44V, 44L), which may include third metal via structures 44V and fourth metal lines 44L. The fifth interconnect-level structure L5 may include a fifth (ILD) layer 35 having formed therein fifth interconnect-level metal interconnect structures (45V, 45L), which may include fourth metal via structures 45V and fifth metal lines 45L. The sixth interconnect-level structure L6 may include a sixth (ILD) layer 36 having formed therein sixth interconnect-level metal interconnect structures (46V, 46L), which may include fifth metal via structures 46V and sixth metal lines 46L. The seventh interconnect-level structure L7 may include a seventh (ILD) layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each (ILD) layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT selector devices may be formed over two vertically adjoining interconnect-level structures.

Figure 2A:
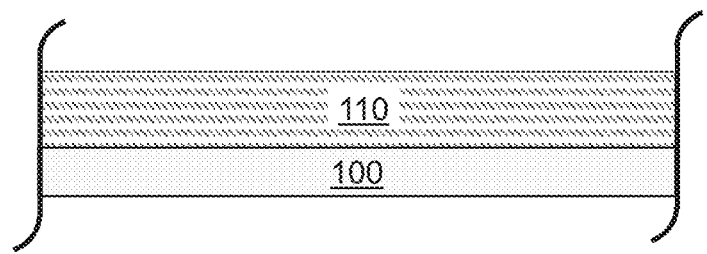
FIGS. 2A-2H are each vertical cross-sectional views illustrating the sequential steps of manufacturing a memory cell, according to various embodiments of the present disclosure.

FIGS. 2A-2H are each vertical cross-sectional views illustrating the steps of a method of forming an FE structure 200, which may be included in the array 95 of FIG. 1C, according to various embodiments of the present disclosure. Referring to FIG. 2A, a first dielectric layer 110 may be deposited over a substrate 100. The substrate 100 may be any suitable substrate, such as a semiconductor device substrate, and may include control elements formed during FEOL processes. In some embodiments, one or more additional dielectric layers, such as ILD layers, may be deposited between the substrate 100 and the first dielectric layer 110. In such embodiments, the first dielectric layer 110 may be omitted.

The first dielectric layer 110 may be formed of any suitable dielectric material such as silicon oxide ($SiO_2$), or the like, or high-k dielectric materials such as silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), or the like. In some embodiments, the first dielectric layer 110 may be a native oxide layer formed on the substrate 100. Other suitable dielectric materials may also be within the contemplated scope of disclosure.

The first dielectric layer 110 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Figure 2B:
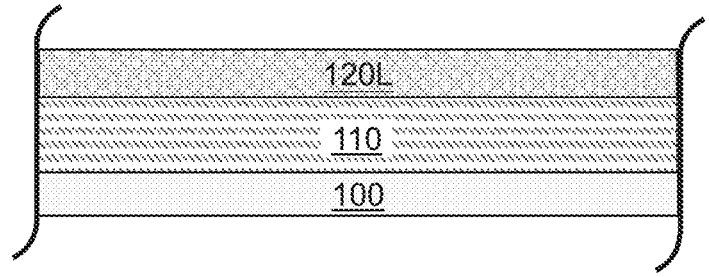

Referring to FIG. 2B, a bottom electrode layer 120L may be deposited on the first dielectric layer 110. For example, the bottom electrode layer 120L may be deposited on the upper surface of the first electric layer 110, such that the bottom electrode layer 120L contacts a top surface of the first dielectric layer 110.

In some embodiments, the bottom electrode layer may be embedded in the first dielectric layer 110. For example, the first dielectric layer 110 may be patterned to form trenches, an electrically conductive material may be deposited in the trenches, and a planarization process may be performed to planarize upper surfaces of the bottom electrode layer 120L and the first dielectric layer 110.

The bottom electrode layer 120L may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), alloys thereof, and/or a combination thereof. Other suitable metallic materials within the contemplated scope of disclosure may also be used. For example, the bottom electrode material layer 120L may include, and/or may consist essentially of, an elemental metal such as W, Cu, Ti, Ta, Ru, Co, Mo, or Pt. The bottom electrode layer 120L may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. The thickness of the bottom electrode layer 120L may be in a range from 10 nm to 100 nm, although lesser and greater thicknesses may also be used.

Figure 2C:
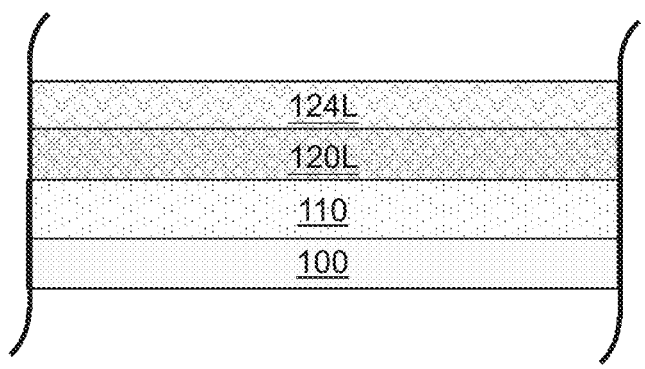

Referring to FIG. 2C, a high-k dielectric layer 124L may be deposited on the bottom electrode layer 120L. Herein, high-k dielectric materials have a dielectric constant greater than 3.9 and may include, but are not limited to, silicon nitride ($SiN_x$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$) (HZO)), tantalum oxide ($Ta_2O_5$), aluminum oxide ($Al_2O_3$), lanthanum aluminate ($LaAlO_3$), hafnium dioxide-alumina ($HfO_2$—$Al_2O_3$), zirconium oxide ($ZrO_2$), magnesium oxide (MgO), combinations thereof, or the like.

Other suitable dielectric materials are within the scope of the present disclosure. The high-k dielectric layer 124L may be deposited using any suitable deposition processes, as described above.

Figure 2D:
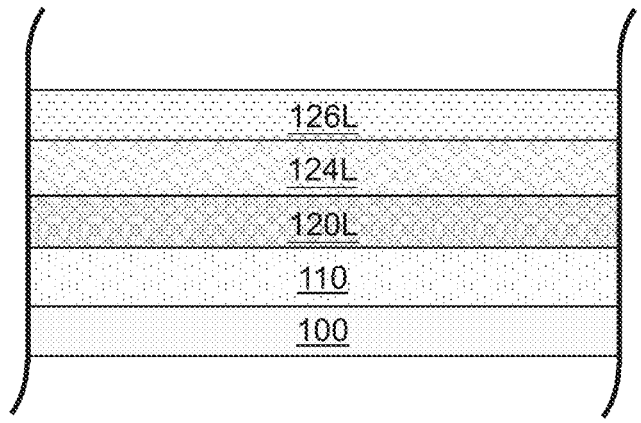

Referring to FIG. 2D, an FE layer 126L (also referred to as an FE/dielectric layer 126 or dielectric layer 126) may be grown on the high-k dielectric layer 124. The FE layer 126L may be formed of any suitable ferroelectric material, such as HfO, $HfO_2$, $ZrO_2$, $Hf_{0.5}Zr_{0.5}O_2$ (HfZrO), HfSiO, HfLaO, AlScN, $PbZrO_3$ (PBT), $Pb[Zr_xTi_{1-x}]O_3$, (0≤x≤1) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, combinations thereof, or the like. In some embodiments, the FE layer 126L may be formed of HfO, $HfO_2$, HfZrO, PZT, $PbTiO_3$. HfLaO, or the like. Other suitable ferroelectric materials are within the contemplated scope of disclosure. Alternatively, the FE layer 126L may be formed by depositing an FE material using any suitable deposition method, such as PVD, spin coating and annealing, sputtering, CVD, ALD, PECVD, spray pyrolysis, pulsed laser deposition (PLD) or combinations thereof. In various embodiments, the FE 126 may be a ferroelectric film that is thin enough to allow tunneling of electrons there through. For example, the thickness of the FE layer 126L may be about 1 nm to about 50 nm thick, such as from about 2 nm to about 25 nm, or about 10 nm thick.

The orthorhombic phase may be the primary crystal phase of the FE layer 126L. For HfO based FE materials, at least 50 at %, such as from about 60 at % to about 99.9 at %, or from about 70 at % to about 95 at % of the FE layer 126L may have an orthorhombic crystal structure. In some embodiments, a tetragonal phase for PBT and/or PZT may be the primary crystalline phase for the FE layer 126L. In some embodiments, the FE layer 126L may be thermally annealed to further improve the crystal structure thereof. For example, the FE layer 126L may be annealed using Excimer-laser annealing (ELA), flash lamp annealing (FLA), furnace annealing, or the like.

Figure 2E:
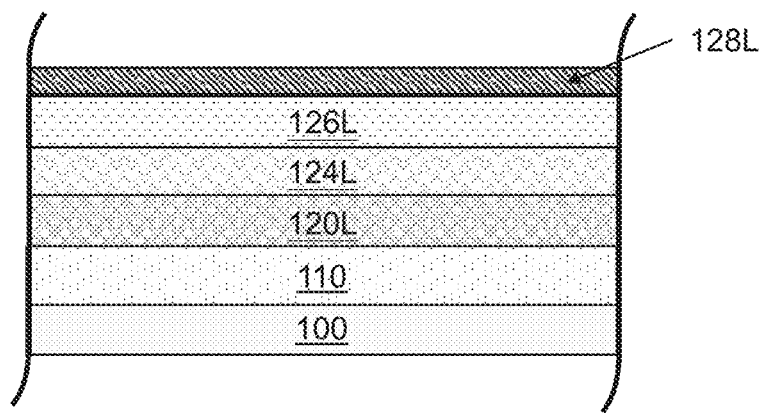

Referring to FIG. 2E, an interface metal layer 128L may be formed on the FE layer 126L. The interface metal layer 128L may include a metal configured to promote the formation of a desired crystal structure, such as an orthorhombic crystal structure, in a layer formed thereon. For example, the interface metal layer 128L may comprise tungsten (W), molybdenum (Mo), ruthenium (Ru), tantalum nitride (TaN), combinations thereof, or the like. The interface metal layer 128L may be deposited using any suitable deposition processes, such as CVD, PVD, or the like. The interface metal layer 128L may have thickness ranging from 0.5 angstrom (A) to 10 A, such as from about 1-8 A.

In some embodiments, an optional anneal process may be performed after depositing the interface metal layer 128L. For example, the interface metal layer 128L may be deposited over the FE layer 126L, and an annealing process may be performed to induce the orthorhombic phase in the FE layer 126L. Other thermal or anneal processes may be performed in any subsequent back-end-of-line (BEOL) to induce the orthorhombic phase in the FE. For example, the interface metal layer 128L may be annealed using Excimer-laser annealing (ELA), flash lamp annealing (FLA), furnace annealing, or the like. The annealing process in a BEOL position may be performed at a temperature below 500° C., such as at a temperature ranging from about 250° C. to about 450° C. In other FEOL or MEOL, the annealing process may be performed at higher temperatures to induce the orthorhombic phase in the FE layer 126L.

Figure 2F:
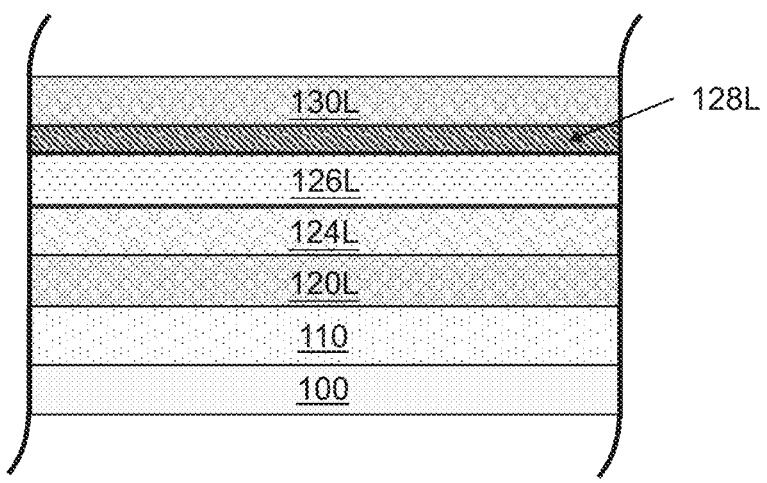

Referring to FIG. 2F, a top electrode layer 130L may be deposited on the FE layer 126L. The top electrode layer 130L may include, and/or may consist essentially of, at least one of a transition metal, a conductive metallic nitride, and a conductive metallic carbide. Exemplary metallic materials that may be used for the top electrode layer 130L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the top electrode layer 130L may include, and/or may consist essentially of, an elemental metal such as W, Cu, Ti, Ta, Ru, Co, Mo, or Pt. The thickness of the top electrode layer 130L may be in a range from 10 nm to 100 nm, although lesser and greater thicknesses may also be used. In some embodiments, the interface metal layer 128L and the top electrode layer 130L may have the same material and may be regarded as the same metal layer.

Figure 2G:
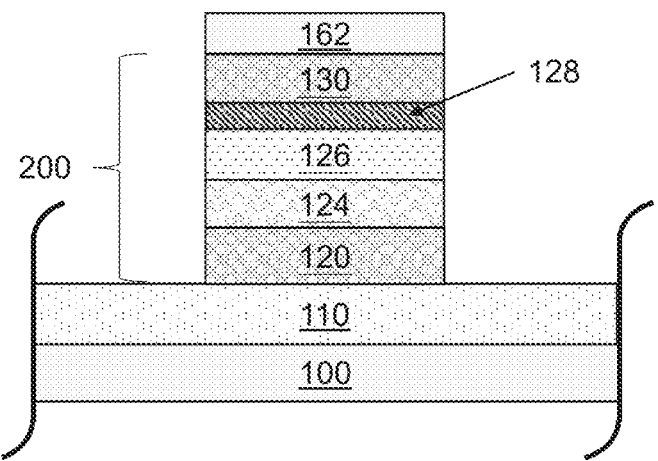

Referring to FIG. 2G, the layered structure (120L, 124L, 126L, 128L, 130L formed in FIG. 2F may be patterned to form at least one memory cells 200. For example, the bottom electrode layer 120L, the high-k dielectric layer 124L, the FE layer 126L, interface metal layer 128L, and the top electrode layer 130L may be etched or otherwise patterned to form a memory cell 200 consisting of a material stack (bottom electrode 120, high-k dielectric 124, FE 126, interface metal 128, and top electrode 130).

A metallic hard mask 162 may be used to pattern the various layers to form the memory cell 200. For example, the metallic hard mask 162 may include a metallic etch stop material that provides high resistance to an anisotropic etch process to be subsequently used to etch a dielectric material (which may include, for example, undoped silicate glass, a doped silicate glass, or organosilicate glass). In one embodiment, the metallic hard mask 162 may include a conductive metallic nitride material (such as TiN, TaN, or WN) or a conductive metallic carbide material (such as TiC, TaC, or WC). Other suitable metallic hard mask materials are within the contemplated scope of disclosure. The metallic hard mask 162 may be deposited by chemical vapor deposition or physical vapor deposition. The thickness of the metallic hard mask 162 may be in a range from 2 nm to 20 nm, such as from 3 nm, to 10 nm, although lesser and greater thicknesses may also be used.

An etch mask (not shown) may be formed over a metallic hard mask material layer to form the metallic hard mask 162. For example, the etch mask may include an array of patterned photoresist material portions that are formed by applying and lithographically patterning a photoresist material layer. Each patterned photoresist material portion may have a horizontal cross-sectional shape of a circle, a rectangle, a rounded rectangle, an ellipse, or any other closed curvilinear shape.

An anisotropic etch process may be performed to transfer the pattern in the etch mask and through the layer stack (120L, 124L, 126L, 128L, 130L) including the metallic hard mask material layer, the top electrode layer 130L, the interface metal layer 128L, the FE layer 126L, the high-k dielectric layer 124L, and the bottom electrode layer 120L. The anisotropic etch process etches unmasked portions of the layer stack (120L, 124L, 126L, 128L, 130L), and forms an array of FTJ memory cells 200.

Each FTJ memory cell 200 includes a vertical stack including a bottom electrode 120, a high-k dielectric 124, an FE 126, an interface metal 128, a top electrode 130, and a metallic hard mask portion 162. In one embodiment, the etch mask may be consumed during the anisotropic etch process, and the metallic hard mask portions 162 may be used as an additional etch mask during patterning of the bottom electrode layer 120L. Each metallic hard mask portion 162 is a patterned portion of the metallic hard mask material layer. Each top electrode 130 is a patterned portion of the top electrode layer 130L. Each interface metal 128 is a patterned portion of the interface metal layer 128L. Each FE 126 is a patterned portion of the FE layer 126L. Each high-k dielectric 124 is a patterned portion of the high-k dielectric layer 124L. Each bottom electrode 120 is a patterned portion of the bottom electrode layer 120L.

The sidewalls of the layers within each ferroelectric tunnel junction memory cell 200 may be vertically coincident, i.e., may be located within a vertical plane including sidewalls of at least one overlying layer and/or at least one underlying layer. The sidewalls of the layers within each ferroelectric tunnel junction memory cell 200 may be vertical, or may have a taper angle in a range from 0.1 degree to 30 degrees. The etch mask and/or metallic hard mask portion 162 may be subsequently removed, for example, by ashing. Optionally, dielectric spacers (not shown) may be formed around the array of ferroelectric tunnel junction memory cells 300.

Figure 2H:
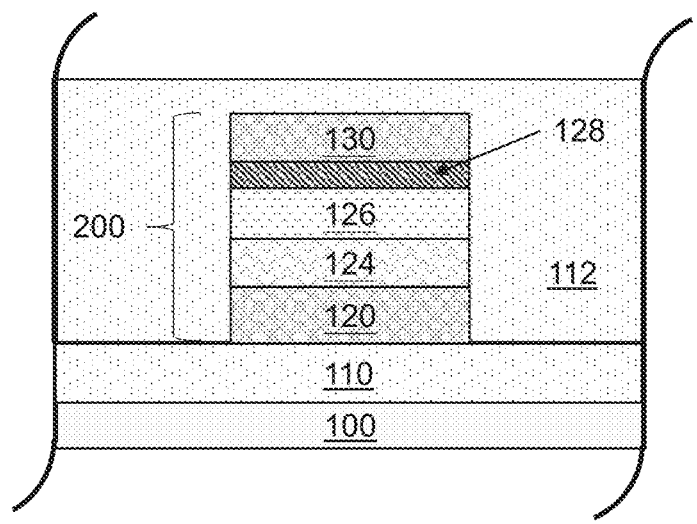

Referring to FIG. 2H, a second dielectric layer 112 (e.g., an interconnect dielectric layer), may be deposited on the first dielectric layer 110, covering the memory cell 200. In particular, the second dielectric layer 112 may be formed of any suitable dielectric material, such as silicon oxide, using any suitable deposition process as described herein. In some embodiments, the second dielectric layer 112 may be omitted. In some embodiments, the memory cell 200 may be encapsulated before depositing the second dielectric layer 112. In other embodiments, such as shown and described below with reference to FIG. 7, the memory cell 200 may be coupled with a select transistor. The select transistor may be a conventional planar CMOS transistor, a finFET transistor, TFT or any other suitable select transistor. The select transistor may be fabricated in a FEOL, MEOL or BEOL process.

Figure 3A:
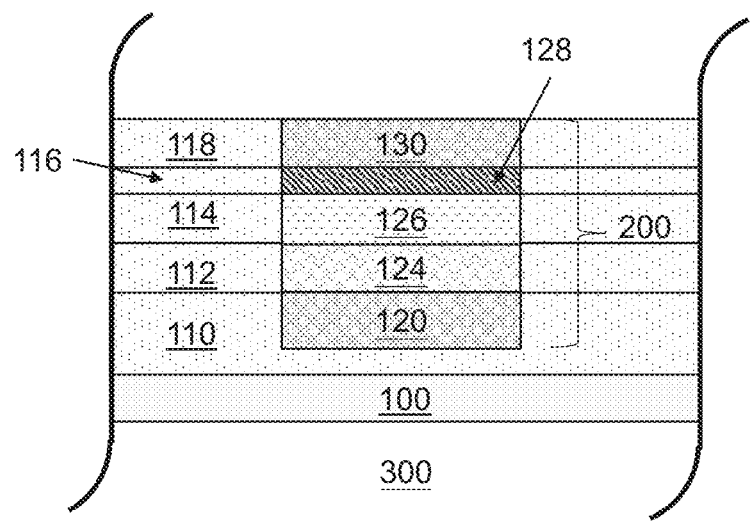
FIG. 3A is a vertical cross-sectional view illustrating the memory cell formed according to an alternative embodiment method of the present disclosure.

FIG. 3A is a vertical cross-sectional view of an alternative embodiment memory cell 300 when formed by an alternate method. Referring to FIG. 3A, a first dielectric layer 110 deposited on a substrate 100. The first dielectric layer 110 may be patterned to form a trench, for example, by photolithography. A bottom electrode layer (e.g., 120L) may be deposited in the trench to form a bottom electrode 120. A planarization process, such as chemical mechanical planarization (CMP) process, may be performed to planarize upper surfaces of the first dielectric layer 110 and the bottom electrode 120.

A second dielectric layer 112 may be deposited on the first dielectric layer 110 and the bottom electrode 120. The second dielectric layer 112 may be patterned to form a trench that exposes a top surface of the bottom electrode 120. A high-k dielectric layer (e.g., 124L) may be deposited in the trench and on the bottom electrode layer 120 to form a high-k dielectric 124, such that a bottom surface of the high-k dielectric 124 is in contact with a top surface of the bottom electrode 120. A planarization process, such as CMP, may be performed to planarize upper surfaces of the high-k dielectric 124 and the second dielectric layer 112.

A third dielectric layer 114 may be deposited on the second dielectric layer 112 and the high-k dielectric layer 124. The third dielectric layer 114 may be patterned to form a trench that exposes a top surface of the high-k dielectric 124. An FE layer (e.g., 126L) may be deposited on the high-k dielectric layer 124 and in the trench to form an FE 126, such that a bottom surface of the FE 126 is in contact with a top surface of the high-k dielectric 124. A planarization process, such as CMP, may be performed to planarize upper surfaces of the FE layer 126 and the third dielectric layer 114.

A fourth dielectric layer 116 may be deposited on the third dielectric layer 114 and the FE 126. The fourth dielectric layer 116 may be patterned to form a trench that exposes a top surface of the FE 126. An interface metal layer (e.g., 128L) may be deposited on the FE 126 and in the trench to form an interface metal 128, such that a bottom surface of the interface metal 128 is in contact with a top surface of the FE 126. A planarization process, such as CMP, may be performed to planarize upper surfaces of the interface metal 128 and the fourth dielectric layer 116.

A fifth dielectric layer 118 may be deposited on the fourth dielectric layer 116 and the interface metal 128. The fifth dielectric layer 118 may be patterned to form a trench that exposes a top surface of the interface metal 128. A top electrode layer (e.g., 130L) may be deposited on the interface metal 128 and in the trench to form a top electrode 130, such that a bottom surface of the top electrode 130 is in contact with a top surface of the interface metal 128. A planarization process, such as CMP, may be performed to planarize upper surfaces of the top electrode 130 and the fifth dielectric layer 118.

Figure 3B:
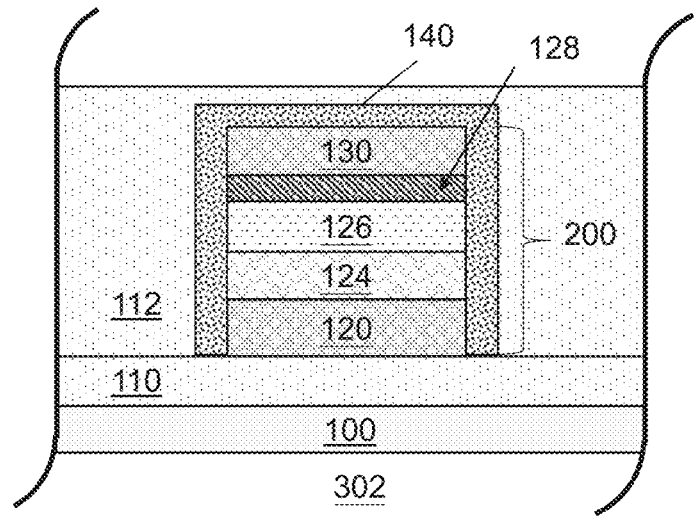
FIG. 3B is a vertical cross-sectional view illustrating a memory cell formed according to another alternative embodiment method of the present disclosure.

FIG. 3B is a vertical cross-sectional view of the memory cell 200 when formed by an alternate method. Referring to FIG. 3B, a memory cell 200 may be formed as discussed above with respect to FIGS. 2A-2H. An encapsulation layer 140 may be formed on the memory cell 200 using an encapsulation material and any suitable deposition process. For example, suitable encapsulation materials may include silicon nitride, aluminum oxide, or the like. A second dielectric layer 112 may then be optionally deposited on the encapsulation layer 140. For example, after the deposition of the encapsulation layer 140, the second dielectric layer 112 may be deposited over the structure 200 and encapsulation layer 140. The second dielectric layer 112 may be subsequently planarized as discussed above.

Figure 4A:
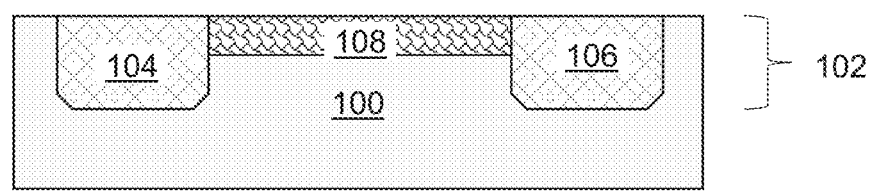
FIGS. 4A-4G are each vertical cross-sectional views illustrating the sequential steps of manufacturing a transistor, according to various embodiments of the present disclosure.
Figure 4B:
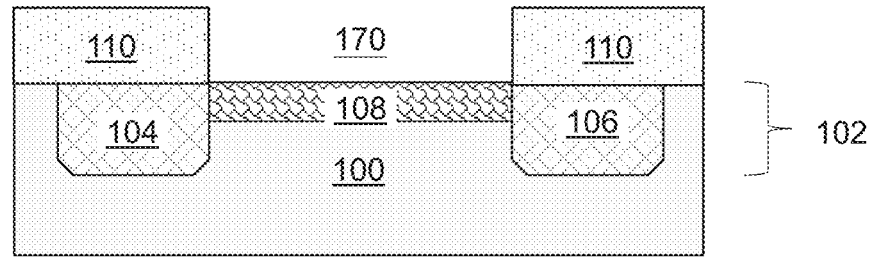
Figure 4C:
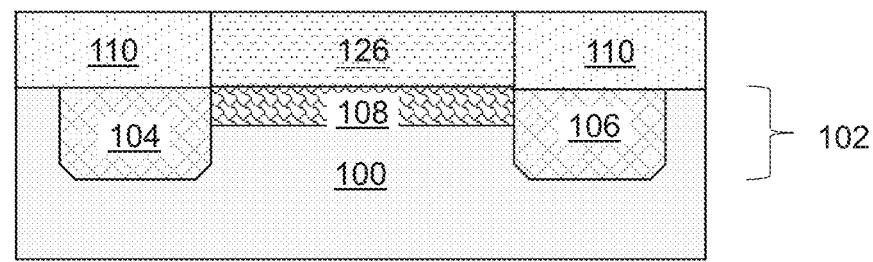
Figure 4D:
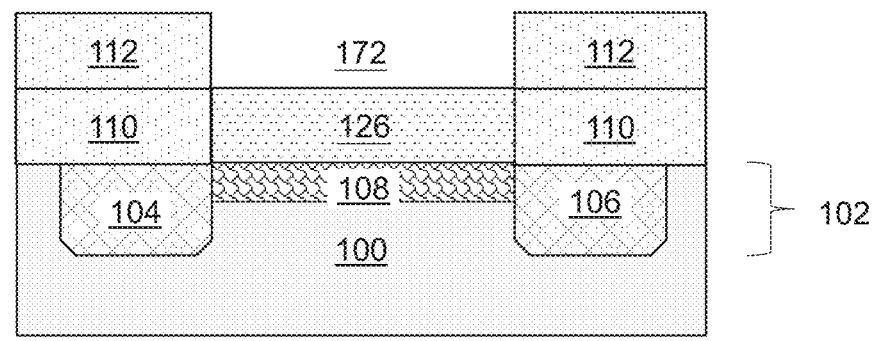
Figure 4E:
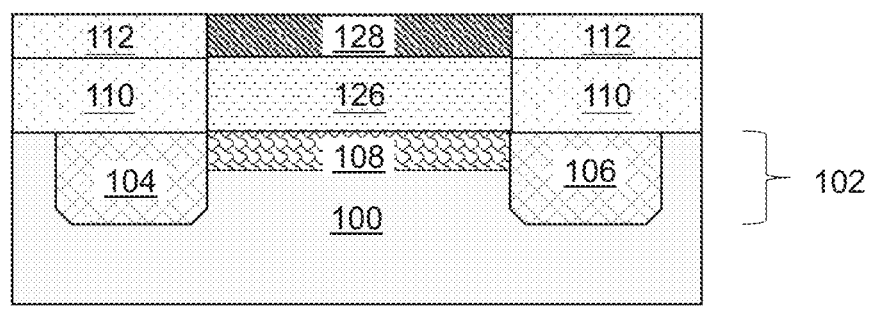
Figure 4F:
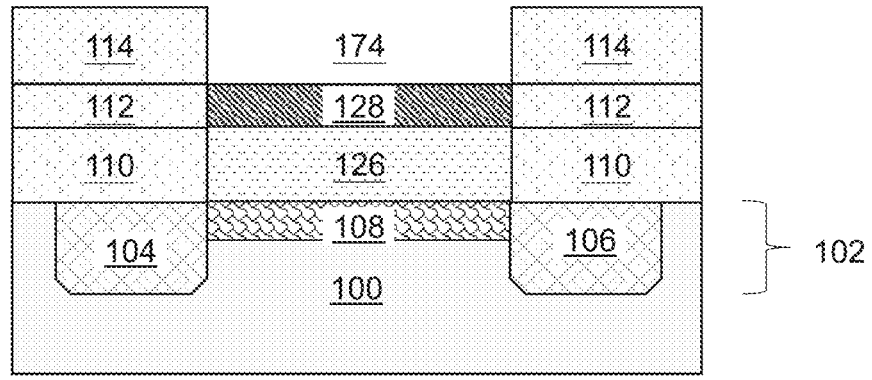
Figure 4G:
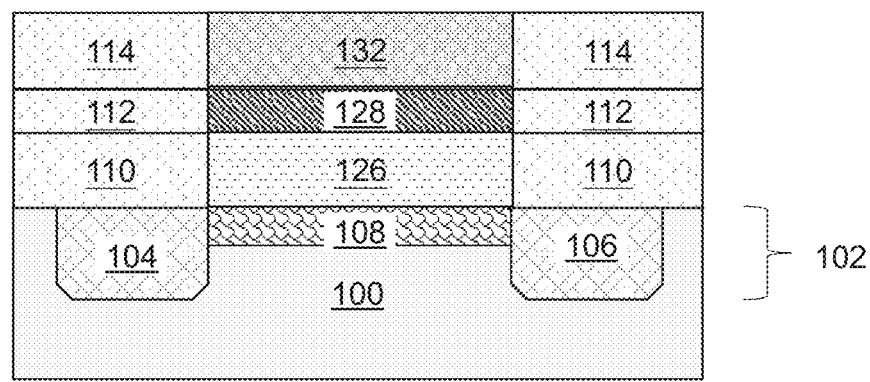

FIGS. 4A-4G are vertical cross-sectional views showing a method of forming a FeFET 400, according to various embodiments of the present disclosure. For illustrative purposes, the process described in FIGS. 4A-4G implement an etching and CMP similar to the processes of FIG. 3A as described. In some embodiments, the structure as illustrated in FIG. 4G may be formed using processes similar to those in FIGS. 2-2H as described.

Referring to FIG. 4A, a semiconductor layer 102 may be formed on a semiconductor substrate 100, such as an amorphous silicon or polysilicon substrate. The semiconductor layer 102 may include a source region 104 and a drain region 106, which may be formed by doping portions of the substrate 100 with P or N-type impurities. For example, the source and drain regions 104, 106 may be formed by ion-implantation processes, or the like. A channel region 108 of the transistor 300 may be disposed between the source region 104 and drain region 106. The channel region 108 may include P or N-type impurities that are different from the P or N-type impurities doped into the source region 104 and drain region 106, such that the channel region 108 has a different conductivity-type than the source region 104 and drain region 106. In alternative embodiments, the semiconductor layer 102 may utilize other suitable semiconductor materials such as polysilicon, amorphous silicon, or a semiconducting oxide, such as InGaZnO (IGZO), indium tin oxide (ITO), InWO, InZnO, InSnO, GaOx, InOx, or the like to form the channel region 108 and other non-silicon materials to form the source region 104 and drain region 106.

Referring to FIG. 4B, a first dielectric layer 110 may be formed on the semiconductor layer 102. The first dielectric layer 110 may be patterned to form a trench 170 that exposes a top surface of the channel region 108. For example, a photoresist layer (not shown) may be applied over the first dielectric layer 110. The photoresist layer may then be patterned for example, using photolithography techniques such that portions of the first dielectric layer 110 disposed over the channel region 108 are exposed. The exposed portions of the first dielectric layer 110 may be etched to form trench 170.

Referring to FIG. 4C, an FE layer (e.g., 126L) may be deposited on the channel region 108 and in the trench 170 to form an FE 126, such that a bottom surface of the FE 126 is in contact with a top surface of the channel region 108. A planarization process, such as CMP, may be performed to remove any excess FE material and to planarize upper surfaces of the FE 126 and the first dielectric layer 110 to be co-planar. The FE 126 may be formed of materials and processes as described above with regard to FIG. 2E.

Referring to FIG. 4D, a second dielectric layer 112 may be deposited and patterned over the FE 126 and the first dielectric layer 110. In a similar manner as described above, the second dielectric layer 112 may be patterned to form a trench 172 that exposes a top surface of the FE 126.

Referring to FIG. 4E, an interface metal layer (e.g., 128L) may be deposited on the channel region 108 and in the trench 172 to form an interface metal 128, such that a bottom surface of the interface metal 128 is in contact with a top surface of the FE 126. A planarization process, such as CMP, may be performed to planarize upper surfaces of the interface metal 128 and the second dielectric layer 112.

The FE 126 may have an orthorhombic crystal structure resulting from being in contact with the interface metal 128. The orthorhombic phase may be the primary crystal phase of the FE 126. In particular, at least 50 at %, such as from about 60 at % to about 99.9 at %, or from about 70 at % to about 95 at % of the FE layer 130 may have an orthorhombic crystal structure.

Referring to FIG. 4F, a third second dielectric layer 114 may be formed on the interface metal 128 and the second dielectric layer 112. In a similar manner as described above, the third dielectric layer 114 may be patterned to form a trench 174 that exposes a top surface of the interface metal 128.

Referring to FIG. 4G, a gate electrode layer may be deposited on the interface metal and in the trench 174 to form a gate electrode 132, such that a bottom surface of the gate electrode 132 is in contact with a top surface of the interface metal 128. A gate electrode 132 may be formed on the FE layer 126. The gate electrode 132 may include an electrically conductive material, and may be formed by any suitable deposition process, as described above with respect to the bottom and top electrodes 120 and 130. In some embodiments, the gate electrode 132 may include an N-type work function material, such as Ta, TiAl, etc., or may include a P-type work function material, such as TiN, $WO_3$, etc. The work function of the gate electrode 132 may be selected based on the conductivity type of the channel region 108. A planarization process, such as CMP, may be performed to planarize the upper surfaces of the gate electrode 132 and the third dielectric layer 114.

In various embodiments, the source region 104 may be electrically connected to a source electrode or bit line through contact vias (not shown). The drain region 106 may be electrically connected to a drain electrode through contact vias (not shown). The gate electrode 132 may be electrically connected to a word line of a semiconductor device, such as a memory device.

Figure 5A:
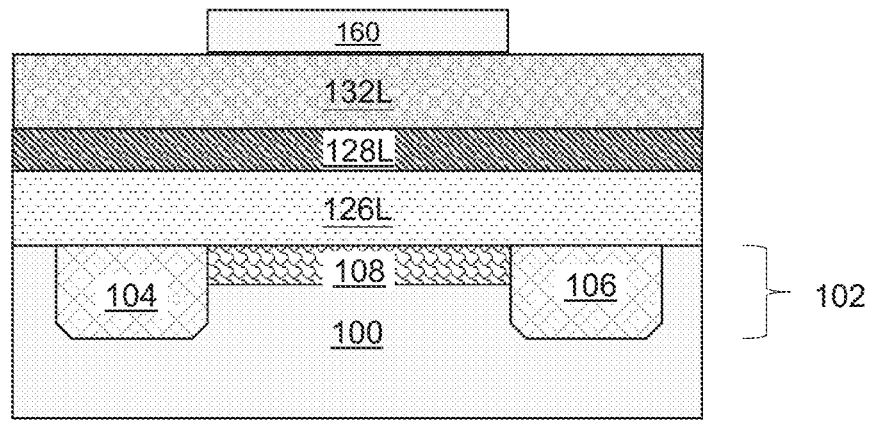
FIGS. 5A and 5B are vertical cross-sectional views illustrating the steps of an alternative method of manufacturing a transistor, according to various embodiments of the present disclosure.
Figure 5B:
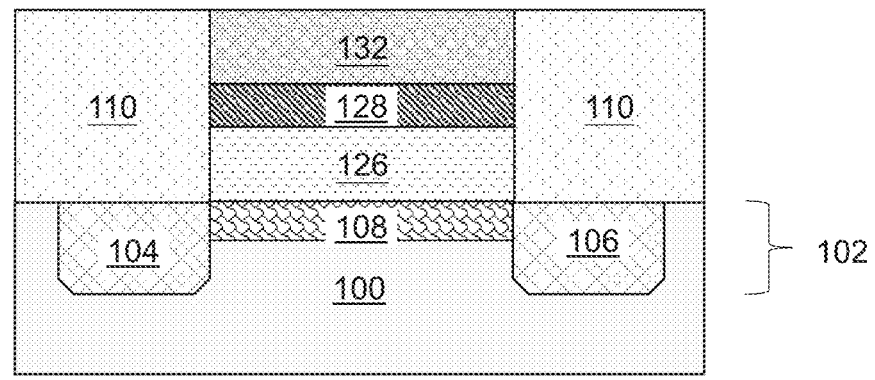

FIGS. 5A and 5B are vertical cross-sectional views of an alternative method of forming a transistor 400, according to various embodiments of the present disclosure. Referring to FIG. 5A, an FE layer 126L may be deposited on a substrate 100 including a semiconductor structure 102 including a source region 104, a drain region 106, and a channel region 108. An interface metal layer 128L may be deposited on the FE layer 126L, and a gate electrode material layer 132L may be deposited on the interface metal layer 128L. A patterned photoresist layer 160 may be deposited over the gate electrode material layer 132L and patterned using photolithography techniques.

Referring to FIGS. 5A and 5B, the FE layer 126L, the interface metal layer 128L, and the gate electrode material layer 132L may be etched, using the photoresist layer 160 as a mask, to form an FE 126, and interface metal 128, and a gate electrode 132. A first dielectric layer 110 may be deposited on the resulting structure. In particular, a first dielectric layer 110 may be deposited on the substrate 100 so as to cover the source region 104, the drain region 106, and the gate electrode 132. A planarization process, such as CMP, may be performed to planarize top surfaces of the first dielectric layer 110 and the gate electrode 132.

Figure 6A:
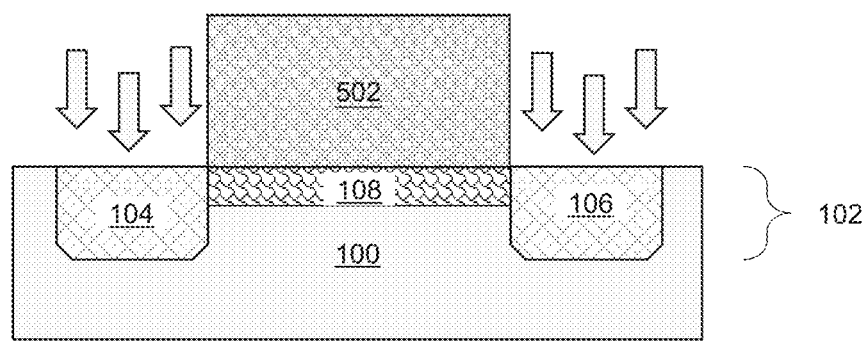
FIGS. 6A-6C are sequential vertical cross-sectional views illustrating the sequential steps of manufacturing a transistor, according to various alternative embodiments of the present disclosure.
Figure 6B:
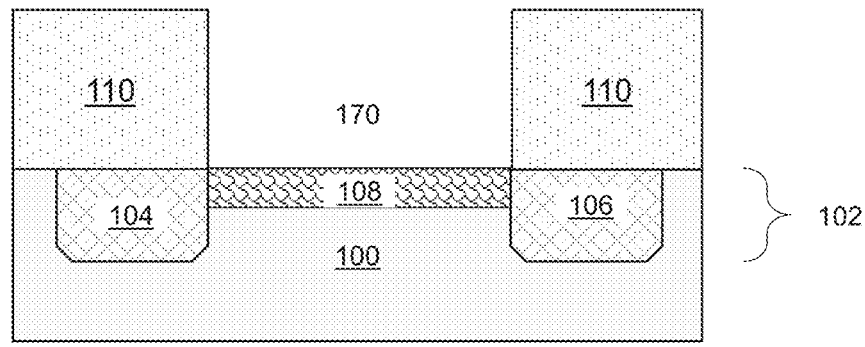
Figure 6C:
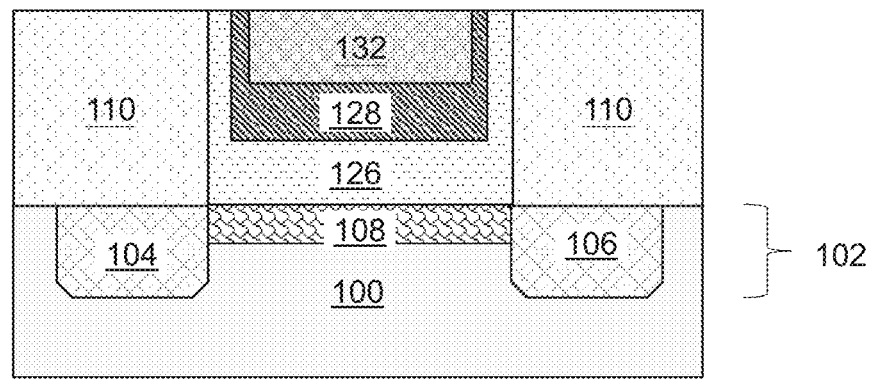

In other embodiments, the gate electrode 132 may be formed using a replacement gate process. For example, the gate electrode 132 may formed to include a sacrificial material layer such as a p-doped polysilicon material, n-doped polysilicon material, a silicon-germanium alloy, amorphous carbon or a dielectric material. In a subsequent processing step, the sacrificial material layer may be replaced with a high conductive metal layer. FIGS. 6A-6C are a vertical cross-sectional views showing a method of forming of a transistor 500, according to various other embodiments of the present disclosure. Referring to FIG. 6A, similar to other embodiments described herein, a semiconductor structure 102 may be formed on a semiconductor substrate 100, such as an amorphous silicon or polysilicon substrate. The semiconductor structure 102 may include a source region 104 and a drain region 106, which may be formed by doping portions of the substrate 100 with P or N-type impurities. For example, the source and drain regions 104, 106 may be formed by ion-implantation processes, or the like. A channel region 108 of the transistor 400 may be disposed between the source and drain regions 104, 106. The channel region 108 may include P or N-type impurities that are different from the P or N-type impurities doped into the source and drain regions 104, 106, such that the channel region 108 has a different conductivity-type than the source regions 104 and drain regions 106.

In alternative embodiments, the semiconductor layer 102 may utilize other suitable semiconductor materials such as polysilicon, amorphous silicon, or a semiconducting oxide, such as InGaZnO (IGZO), indium tin oxide (ITO), InWO, InZnO, InSnO, GaOx, InOx, or the like to form the channel region 108 and other non-silicon materials to form the source region 104 and drain region 106.

According to various embodiments, the semiconductor structure 102 may be formed using a replacement gate process. In particular, a replacement gate 502 (e.g., a dummy gate) may be formed on the substrate 100, covering the channel region 108. The replacement gate 502 may be formed by depositing a polysilicon material, for example, by physical vapor deposition (PVD) or chemical vapor deposition (CVD). The deposited material may be patterned and etched (e.g., wet or dry etched) to form the replacement gate 502. In embodiments that use doped source and drain regions, an ion implantation process may then be performed, using the replacement gate 502 as a mask, to dope the semiconductor substrate 100 with impurities and form the source and drain regions 104, 106. In other embodiments, the replacement gate 502 may be used as a hard mask to form cavities to deposit the non-silicon materials (i.e., metals) to form the source regions 104 and drain regions 106.

Referring to FIG. 6B, the first dielectric layer 110 may be formed on the semiconductor structure 102. For example, the first dielectric layer 110 may be formed over the replacement gate 502, the resulting structure may optionally be planarized, and then the replacement gate 502 may be removed to form the trench 170.

Referring to FIG. 6C, an FE layer (e.g., 126L) may be conformally deposited on the channel region 108 and in the trench 170 to form an FE 126, such that a bottom surface of the FE 126 is in contact with a top surface of the channel region 108. The conformal deposition may result in U-shaped layers in which the FE layer 126 may also be deposited on the sidewalls of the first dielectric layer 110.

An interface metal layer (e.g., 128L) may be conformally deposited on the channel region 108 and in the trench 170 to form an interface metal 128, such that a bottom surface of the interface metal 128 is in contact with a top surface of the FE 126. The conformal deposition may result in U-shaped layers in which the interface metal 128 may also be deposited on the sidewalls of the FE layer 126. As noted above, the FE 126 may have an orthorhombic crystal structure resulting from being in contact with the interface metal 128. The orthorhombic phase may be the primary crystal phase of the FE 126. In particular, at least 50 at %, such as from about 60 at % to about 99.9 at %, or from about 70 at % to about 95 at % of the FE layer 130 may have an orthorhombic crystal structure.

A gate electrode layer may be conformally deposited on the interface metal 128 and in the trench 170 to form a gate electrode 132, such that a bottom surface of the gate electrode 132 is in contact with a top surface of the interface metal 128. The gate electrode 132 may include an electrically conductive material, and may be formed by any suitable deposition process, as described above with respect to the bottom and top electrodes 120 and 130. In some embodiments, the gate electrode 132 may include an N-type work function material, such as Ta, TiAl, etc., or may include a P-type work function material, such as TiN, $WO_3$, etc. The work function of the gate electrode 132 may be selected based on the conductivity type of the channel region 108.

A planarization process, such as CMP, may be performed to planarize the upper surfaces of the gate electrode 132, interface metal layer 128, the FE layer 126 and the first dielectric layer 110.

In various embodiments, the source region 104 may be electrically connected to a source electrode or bit line through contact vias (not shown). The drain region 106 may be electrically connected to a drain electrode through contact vias (not shown). The gate electrode 132 may be electrically connected to a word line of a semiconductor device, such as a memory device.

In some embodiments, the source and drain regions 104, 106 may be formed by depositing a doped metal layer on the substrate 100 overlapping with the channel region 108, or in trenches formed adjacent to the channel region 108. The metal layer may include metals such as Sc, Ti, Cr, Ni, Al, Nb, Pd, Pt, Au, Ag, or the like, and may be formed using any suitable method, such as PVD, CVD, ALD, or the like.

In some embodiments, after depositing the metal layer, an annealing process, such as a rapid thermal annealing process, may be performed, such that the metal diffuses into the substrate 100 and forms the source and drain regions 104, 106. In some embodiments, the metal may form a metal silicide in the source and drain regions 104, 106. The annealing process may be performed at a temperature below 500° C., such as at a temperature ranging from about 250° C. to about 450° C. The metal layer may be subsequently removed, for example, by selective etching. In other embodiments, the metal layer may be patterned to form source and drain electrodes.

While the transistor 500 is depicted as having a top-gate configuration, the present disclosure is not limited thereto. For example, in other embodiments, the transistor 500 may have a bottom-gate configuration.

Figure 7A:
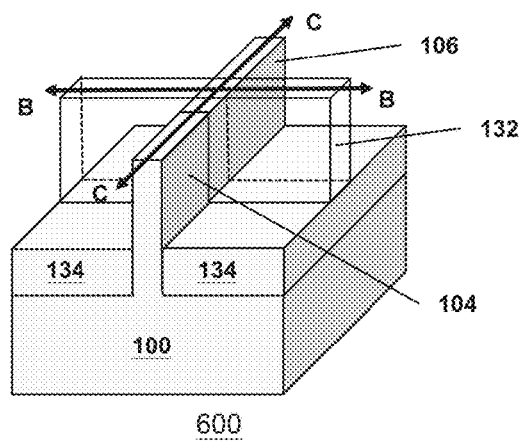
FIG. 7A is a partially transparent perspective view of a transistor according to various embodiments of the present disclosure
Figure 7B:
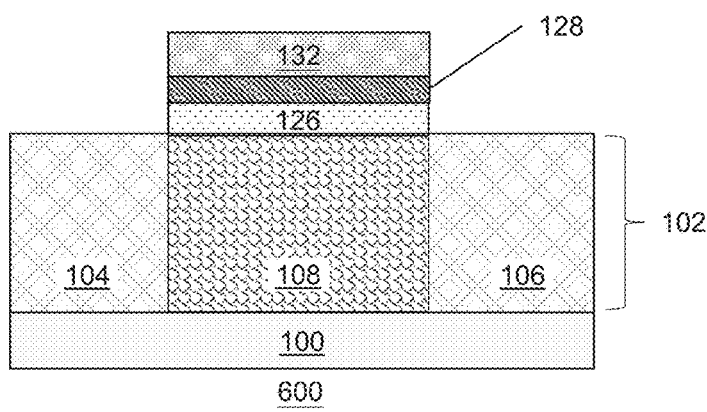
FIG. 7B is a vertical cross-sectional view along line B-B of FIG. 7A.
Figure 7C:
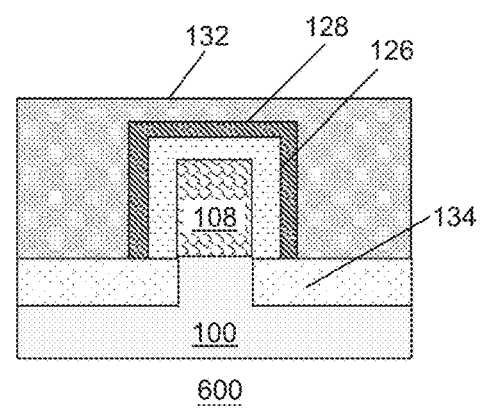
FIG. 7C is a vertical cross-sectional view taken along line C-C of FIG. 7A.

FIG. 7A is a partially transparent perspective view of a transistor 600, according to various embodiments of the present disclosure. FIG. 7B is a vertical cross-sectional view taken along line B-B of FIG. 7A. FIG. 7C is a vertical cross-sectional view taken along line C-C of FIG. 7A. The transistor 600 is similar to the transistor 400 of FIGS. 4G and 5B as well as transistor 500 of FIG. 6C. Accordingly, only the differences there between will be described in detail.

Referring to FIGS. 7A-7C, the transistor 600 may be a ferroelectric fin field-effect transistor (FinFET). In some embodiments, the transistor 600 may operate as a memory structure. The semiconductor structure 102 may be in the form of a "fin" that extends vertically from the surface of a semiconductor substrate 100. The semiconductor structure 102 includes a source region 104, a drain region 106, and a channel region 108 disposed there between.

The transistor 600 may include an FE 126 disposed on the channel region 108. The FE 126 may be otherwise similar to the FE 126 of the transistor 400 of FIGS. 4G and 5B. In various embodiments, the FE 126 may be disposed on multiple surfaces of the channel region 108, such as on the top and opposing side surfaces of the channel region 108.

The transistor 600 may include an interface metal 128 disposed on the FE 126. In particular, the interface metal 128 may be disposed on the FE 126, with the interface metal 128 promoting the formation of an orthorhombic structure of the FE 126. The interface metal 128 may be otherwise similar to the interface metal 128 of the transistor 400 of FIG. 4. In various embodiments, the interface metal 128 may be disposed on multiple surfaces of the FE 126, such as on the top and opposing side surfaces of the FE 126 (as illustrated in FIG. 5B).

The transistor 600 may include a gate electrode 132 disposed on the interface metal 128. The gate electrode 132 may be otherwise similar to the gate electrode 132 of the transistor 400 of FIGS. 4G and 5B. In various embodiments, the gate electrode 132 may be disposed on multiple surfaces of the interface metal 128, such as on the top and opposing side surfaces of the interface metal 128 (as illustrated in FIG. 6B).

The transistor 600 may include a dielectric layer 134, such as an oxide layer, that surrounds a portion of the semiconductor layer 102 adjacent to the substrate 100. In particular, the dielectric layer 134 may be configured to insulate the gate electrode 132, the interface metal 128, and/or the FE 126 from the substrate 100 and/or channel region 108.

Figure 8:
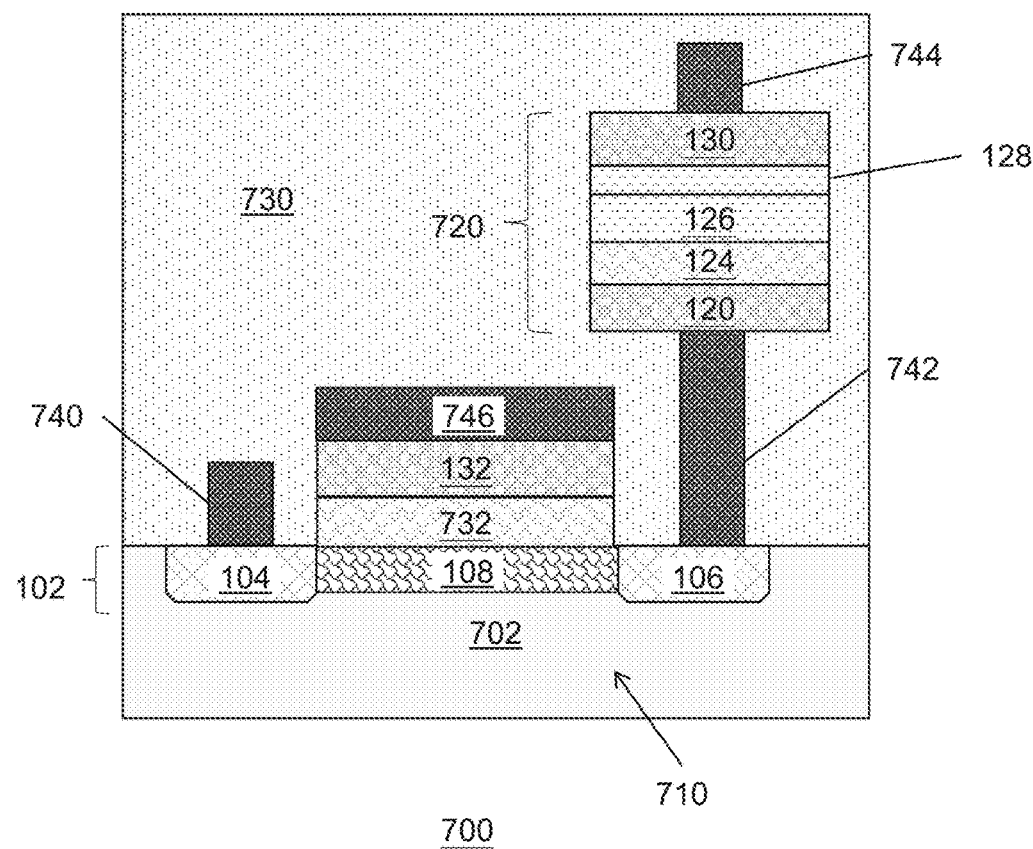
FIG. 8 is a vertical cross-sectional view of a memory device, according to various embodiments of the present disclosure.

FIG. 8 is a vertical cross-sectional view of a FeRAM memory structure 700, according to various embodiments of the present disclosure. The memory structure 700 may be included in a memory device, such as the memory device of FIGS. 1A-1C. The memory structure 700 may include a transistor 710 and an FTJ memory cell 720. Accordingly, the memory structure 700 may have a 1 transistor-1 capacitor (1T-1C) configuration. Any other suitable configuration including more than one transistor and/or more than one capacitor are within the scope of the present disclosure. For example, a memory structure may include a 2T/2C configuration.

The transistor 710 may be disposed on a substrate 702. The substrate 702 may be a semiconductor substrate, such as an amorphous silicon or polysilicon substrate. In other embodiments, the substrate 702 may be a dielectric layer, such as an interconnect dielectric layer.

The transistor 710 may include a semiconductor layer 102 including a source region 104, a drain region 106, and a channel region 108 disposed there between. The semiconductor layer 102 may be formed of polysilicon, amorphous silicon, or a semiconducting oxide, such as InGaZnO (IGZO), indium tin oxide (ITO), InWO, InZnO, InSnO, GaOx, $InO_x$, or the like. Accordingly, the transistor 710 may be a CMOS transistor, if the substrate 702 is an amorphous silicon or polysilicon substrate, and the transistor may be a TFT transistor, if the substrate 702 is a layer formed during a BEOL process. In embodiments in which the transistor 710 is a FEOL transistor, the channel region 108 may be formed of silicon, or a compound including silicon. In embodiments in which the transistor 710 is a BEOL transistor, the channel region 108 may be formed of a semiconducting oxide, such as InGaZnO (IGZO), indium tin oxide (ITO), InWO, InZnO, InSnO, GaOx, $InO_x$, or the like.

A high-k dielectric layer 732 may be disposed on the channel region 108. In various embodiments, the high-k dielectric layer 732 may have a thickness ($t_{hk}$) in the range of 0.5-5.0 nm, such as 1-4 nm, although greater or lesser thicknesses may be used.

A gate electrode 132 may be disposed on the high-k dielectric layer 732. The gate electrode 132 may be formed of any suitable electrically conductive material, using any suitable deposition process, as described herein.

The FTJ 720 may be similar to the memory cell 200 shown in FIG. 2H, the FTJ 300 shown in FIG. 3A, or the FTJ 302 shown in FIG. 3B. Accordingly, the FTJ 720 may include a bottom electrode 120, a high-k dielectric 124, an FE 126, an interface metal 128, and a top electrode layer 130, which may be formed as described above.

The source region 104 may be electrically connected to a bit line 740, the drain region 106 may be electrically connected to the bottom electrode layer 120 by a drain via contact 742, and the top electrode layer 130 may be electrically coupled to a plate line 744. The gate electrode 132 may be electrically connected to a word line 746. A dielectric layer 730, such as an interconnect dielectric layer, may be disposed on the substrate 702. In particular, the high-k dielectric layer 124, gate electrode 132, word line 744, bit line 740, drain via contact 742, and FTJ 720 may be embedded in the dielectric layer 730.

Figure 9:
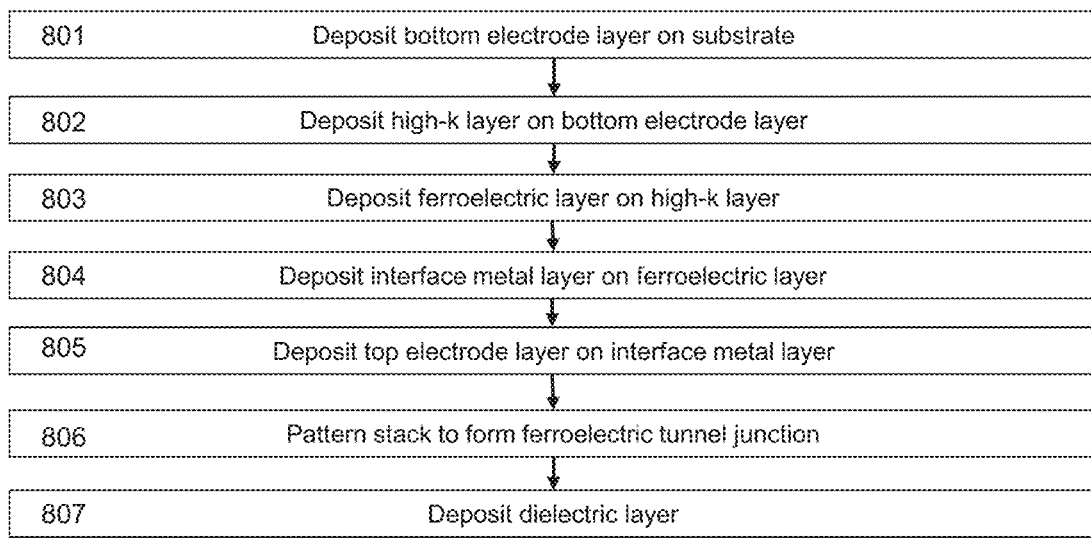
FIG. 9 is a block diagram illustrating a method of forming a memory cell according to various embodiments.

FIG. 9 is a flow chart illustrating steps of a method of forming an FTJ 200 or FTJ 300 as shown in FIGS. 2H and 3A, according to various embodiments of the present disclosure. Referring to FIGS. 2A-2H and 3A, in step 801, a bottom electrode layer 120L may be deposited on a substrate, such as a dielectric layer 110. The bottom electrode layer 120L may be formed by depositing an electrically conductive material, such as copper, aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), alloys thereof, or the like. In some embodiments, the bottom electrode may be formed of TiN, Ru, W, Mo, TaN, or the like.

The bottom electrode layer 120L may be formed using any suitable deposition process. For example, suitable deposition processes may include PVD), sputtering, CVD, atomic layer deposition (ALD), PECVD, or combinations thereof. In some embodiments, the top electrode layer 130 may be formed of TiN, Ru, W, Mo, TaN, or the like.

In step 802, a high-k dielectric layer 124L may be deposited on the bottom electrode layer 120L. The high-k dielectric layer 124L may be formed of a high-k material such as silicon nitride ($SiN_x$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$) (HZO)), tantalum oxide ($Ta_2O_5$), aluminum oxide ($Al_2O_3$), lanthanum aluminate ($LaAlO_3$), hafnium dioxide-alumina ($HfO_2$—$Al_2O_3$), zirconium oxide ($ZrO_2$), magnesium oxide (MgO), combinations thereof, or the like. Other suitable dielectric materials are within the scope of the present disclosure. The high-k dielectric layer 124L may be deposited using any suitable deposition processes, as described above. In some embodiments, the high-k dielectric layer 124L may comprise $Al_2O_3$, MgO, $LaAlO_3$, or the like.

In step 803, an FE layer 126L may be deposited on the high-k dielectric layer 124. The FE layer 126L may be formed using any suitable deposition process, using any suitable FE material, as described herein such as, $HfO_2$, $ZrO_2$, $Hf_{0.5}Zr_{0.5}O_2$ (HfZrO), HfSiO, HfLaO, AlScN, $PbZrO_3$, $Pb[Zr_xTi_{1-x}]O_3$, ($0 \leq x \leq$) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, combinations thereof, or the like. In some embodiments, the FE layer 126L may be formed of $HfO_2$, HfZrO, PZT, $PbTiO_3$, HfLaO, or the like.

In step 804, an interface metal layer 128L may be deposited over the FE layer 126L. The interface metal layer 128L may include a metal configured to promote the formation of a desired crystal structure in a layer formed thereon. For example, the interface metal layer 128L may comprise W, Mo, Ru, TaN, combinations thereof, or the like. The interface metal layer 128L may be deposited using any suitable deposition processes, such as CVD, PVD, or the like. The interface metal layer 128L may have thickness ranging from 0.5 A to 10 A, such as from about 1-8 A.

In some embodiments, an anneal process may be performed after depositing the interface metal layer 128L. For example, the interface metal layer 128L may be deposited over the FE layer 126L, and an annealing process may be performed to induce the orthorhombic phase in the FE layer 126L. Other thermal or anneal processes may be performed in any subsequent BEOL to induce the orthorhombic phase in the FE.

In step 805, a top electrode layer 130L may be formed on the interface metal layer 128L. The top electrode layer 130L may be formed of an electrically conductive material, using processes as described with respect to the bottom electrode layer 120L.

In step 806, the structure formed in steps 801-805 may be patterned to form one or more FTJs 200 or 300. In particular, a photoresist material and/or one or more hard mask/etch mask layers may be deposited on the top electrode layer 130L, patterned using a photolithographic process to form a patterned photoresist layer, and then portions exposed through the photoresist layer of the structure may be etched using a wet or dry etching process.

In step 807, the method may optionally include covering the FTJ 200 with a dielectric layer, using any suitable dielectric material and any suitable deposition process.

Figure 10:
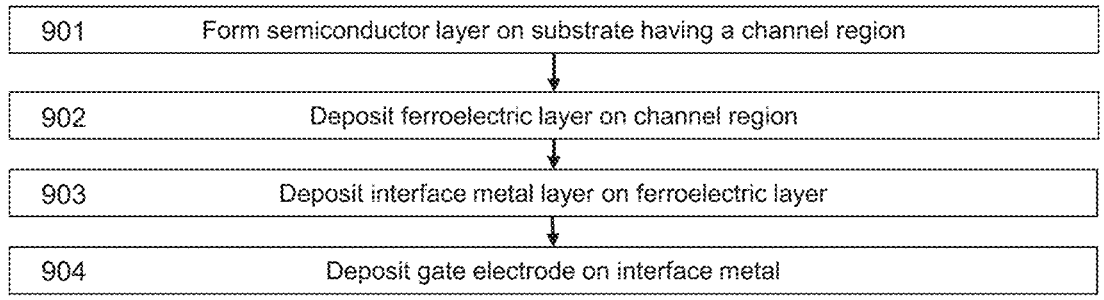
FIG. 10 is a block diagram illustrating a method of forming a transistor according to various embodiments of the present disclosure.

FIG. 10 is a flow chart illustrating steps of a method of forming transistors 400, 500, 600, as shown in FIGS. 4G, 6C, 7A, and 7B, according to various embodiments of the present disclosure. Referring to FIGS. 4G, 6C, 7A, 7B, and 10, in step 901 a semiconductor layer 102 may be formed on a substrate 100. For example, in embodiments in which the transistor may be formed in a FEOL position, the channel region 108 may be formed from silicon. The source region 104 and drain region 106 may be formed by implanting dopants, such as by an ion implantation process. In embodiments in which the transistor may be formed in a BEOL position, the channel region 108 may be formed from of a semiconducting oxide, such as InGaZnO (IGZO), indium tin oxide (ITO), InWO, InZnO, InSnO, GaOx, $InO_x$, or the like. The source region 104 and drain region 106 may be formed from a metal material. Referring to FIGS. 4A-4C, in step 902, an FE 126 may be formed on the channel region 108 within a dielectric layer 110. Referring to FIGS. 4D and 4E, in step 903, an interface metal 128 may be formed on the FE 126 within a dielectric layer 112. Referring to FIGS. 4F and 4G, in step 904, a gate electrode 132 may be deposited on the interface metal 128.

Various embodiments provide a memory device 200, 300, 600 comprising a ferroelectric (FE) structure including a dielectric layer 124L, an FE layer 126L disposed on the dielectric layer 124L, and an interface metal layer 128L disposed on the FE layer 126L, wherein the interface metal layer 128L is configured to induce a formation of an orthorhombic crystal phase in the FE layer 126L. The memory device may further include a top electrode layer 130L disposed on the interface metal layer 128L.

In one embodiment, the interface metal layer 128L may include W, Mo, Ru, TaN, or a combination thereof to induce the FE layer 126L to have the orthorhombic phase. In one embodiment, the top electrode layer 130L and the interface metal layer 128L may be the same material. In one embodiment, the interface metal layer 128L may have a thickness of 1-8 A. In one embodiment, the FE layer 126L may include HfO, HfO2, HfZrO, Pb[ZrxTi1-x]O3, (0≤x≤1), PbTiO3, HfLaO, or a combination thereof. In one embodiment, a primary phase of the FE layer 126L may be orthorhombic and induced by an anneal process on the interface metal layer 128L. In one embodiment, the memory device may further include a bottom electrode layer 120L, in which the dielectric layer 124L is disposed on the bottom electrode layer 120L to dispose the FE structure (124L, 126L, 128L) between the bottom electrode layer 120L and the top electrode layer 130L. In one embodiment, dielectric layer 124L may include AlO, MgO, LaAlO3, or a combination thereof.

In one embodiment, the memory device may further include a substrate 702 and a transistor 710 disposed on the substrate 702, in which the transistor 710 may include a source region (104/106) and a drain region (104/106) formed in the substrate 702, a channel region 108 formed in the substrate 702 between the source and drain regions (104/106), a high-k dielectric layer 732 disposed on the channel region 108, and a gate electrode 132 disposed on the high-k dielectric layer 732. In one embodiment, the bottom electrode layer 120L is electrically connected to the source region or the drain region (104/106). In one embodiment, the memory device may further include a bit line 740 electrically coupled to the source region 104, a drain via contact 742 electrically coupled to the drain region 106 and the bottom electrode layer 120L; and a word line 746 electrically coupled to the gate electrode 132.

Various embodiments provide a transistor 400, 600 a source region 104, a drain region 106, and a channel region 108 disposed between the source region 104 and the drain region 106, an FE layer 126L disposed on the channel region 108, an interface metal layer 128L disposed on the FE layer 126L, wherein the interface metal layer 128L is configured to induce a formation of an orthorhombic crystal phase in the FE layer, and a gate electrode 132 disposed on the interface metal layer 128L. In one embodiment, the interface metal layer 128L may include W, Mo, Ru, TaN, or a combination thereof to induce the FE layer 126L to have the orthorhombic phase. In one embodiment, the gate electrode 132 and the interface metal layer 128L may be the same material. In one embodiment, the interface metal layer 128L may have a thickness of 1-8 A. In one embodiment, the FE layer 126L may comprise HfO, HfO2, HfZrO, Pb[ZrxTi1-x]O3, (0≤x≤1), PbTiO3, HfLaO, or a combination thereof. In one embodiment, the transistor 400, 600 may be a FinFET, such that the interface metal layer 128L surrounds multiple walls of the FE layer 126L.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory cell, further comprising:
   depositing an interface metal layer over a ferroelectric (FE) layer, wherein the interface metal layer is configured to induce a formation of an orthorhombic phase in the FE layer; and
   depositing a top electrode layer over the interface metal layer.

2. The method of claim 1, further comprising:
   performing an annealing process on the interface metal layer to induce the formation of the orthorhombic phase in the FE layer.

3. The method of claim 1, further comprising:
   depositing a high-k dielectric material layer over a bottom electrode layer; and
   depositing the FE layer over the high-k dielectric material layer and beneath the interface metal layer.

4. The method of claim 3, wherein the high-k dielectric material layer comprises AlO, MgO, $LaAlO_3$, or a combination thereof.

5. The method of claim 4, further comprising:
   depositing the bottom electrode layer over a first dielectric layer, wherein the high-k dielectric material layer is deposited on the bottom electrode layer such that the FE layer is disposed between the bottom electrode layer and the top electrode layer.

6. The method of claim 5, further comprising forming a trench in the first dielectric layer, wherein the bottom electrode layer is deposited in the trench formed in the first dielectric layer.

7. The method of claim 1, wherein the interface metal layer comprises tungsten (W), molybdenum (Mo), ruthenium (Ru), tantalum nitride (TaN), or a combination thereof, and wherein the interface metal layer has a thickness of 1-8 Å.

8. The method of claim 1, wherein the top electrode layer and the interface metal layer are a same material.

9. The method of claim 1, wherein the FE layer comprises HfO, $HfO_2$, HfZrO, $Pb[Zr_xTi_{1-x}]O_3$, (0≤x≤1), $PbTiO_3$, HfLaO, or a combination thereof.

10. The method of claim 9, wherein a primary phase of the FE layer is orthorhombic and induced by an anneal process on the interface metal layer.

11. A method of forming a transistor comprising:
   forming a semiconductor layer comprising a source region, a drain region, and a channel region disposed between the source region and the drain region;
   depositing a ferroelectric (FE) layer on the channel region;
   depositing an interface metal layer on the FE layer, wherein the interface metal layer is configured to induce a formation of an orthorhombic crystal phase in the FE layer; and
   forming a gate electrode on the interface metal layer.

12. The method of claim 11, wherein the interface metal layer comprises tungsten (W), molybdenum (Mo), ruthenium (Ru), tantalum nitride (TaN), or a combination thereof to induce the FE layer to have the orthorhombic phase.

13. The method of claim 11, wherein the gate electrode and the interface metal layer are a same material.

14. The method of claim 11, wherein the interface metal layer has a thickness of 1-8 Å.

15. The method of claim 11, wherein the FE layer comprises HfO, $HfO_2$, HfZrO, $Pb[Zr_xTi_{1-x}]O_3$, (0≤x≤1), $PbTiO_3$, HfLaO, or a combination thereof.

16. The method of claim 11, wherein the transistor is a fin field-effect transistor, such that the interface metal layer surrounds multiple surfaces of the FE layer.

17. The method of claim 11, further comprising:
performing an annealing process on the interface metal layer to induce the formation of the orthorhombic phase in the FE layer.

18. A method of forming a memory structure, comprising:
forming a bottom electrode layer;
forming a ferroelectric (FE) structure comprising:
   depositing a dielectric layer on the bottom electrode layer;
   depositing an FE layer on the dielectric layer; and
   depositing an interface metal layer on the FE layer, wherein the interface metal layer is configured to induce a formation of an orthorhombic crystal phase in the FE layer;
depositing a top electrode layer on the interface metal layer;
forming a substrate; and
forming a transistor on the substrate, wherein forming the transistor on the substrate comprises:
   forming a source region and a drain region in the substrate;
   forming a channel region in the substrate between the source region and the drain region;
   depositing a high-k dielectric layer on the channel region; and
   depositing a gate electrode on the high-k dielectric layer, wherein the bottom electrode layer is electrically connected to the drain region.

19. The method of claim 18, further comprising:
performing an annealing process on the interface metal layer to induce the formation of the orthorhombic phase in the FE layer.

20. The method of claim 19, wherein the FE layer comprises HfO, $HfO_2$, HfZrO, $Pb[Zr_xTi_{1-x}]O_3$, (0≤x≤1), $PbTiO_3$, HfLaO, or a combination thereof, and wherein the interface metal layer comprises tungsten (W), molybdenum (Mo), ruthenium (Ru), tantalum nitride (TaN), or a combination thereof, and wherein the interface metal layer has a thickness of 1-8 Å.

* * * * *